United States Patent
Blatchford et al.

(10) Patent No.: US 9,024,450 B2
(45) Date of Patent: May 5, 2015

(54) TWO-TRACK CROSS-CONNECT IN DOUBLE-PATTERNED STRUCTURE USING RECTANGULAR VIA

(71) Applicant: Texas Instruments Incorporated, Dallas, TX (US)

(72) Inventors: James Walter Blatchford, Richardson, TX (US); Scott William Jessen, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/051,078

(22) Filed: Oct. 10, 2013

(65) Prior Publication Data

US 2014/0035160 A1 Feb. 6, 2014

Related U.S. Application Data

(62) Division of application No. 13/410,241, filed on Mar. 1, 2012, now Pat. No. 8,580,675.

(60) Provisional application No. 61/448,423, filed on Mar. 2, 2011.

(51) Int. Cl.
| | | |
|---|---|---|
| H01L 23/528 | (2006.01) | |
| H01L 23/535 | (2006.01) | |
| H01L 23/48 | (2006.01) | |
| H01L 23/522 | (2006.01) | |
| H01L 21/768 | (2006.01) | |

(52) U.S. Cl.
CPC .......... *H01L 23/481* (2013.01); *H01L 23/5226* (2013.01); *H01L 23/528* (2013.01); *H01L 21/76895* (2013.01); *H01L 21/76816* (2013.01); *H01L 21/76838* (2013.01); *H01L 2924/0002* (2013.01)

(58) Field of Classification Search
CPC . H01L 23/481; H01L 23/5226; H01L 23/528; H01L 21/76816; H01L 21/76838; H01L 21/76895; H01L 2924/00; H01L 2924/0002
USPC .................. 438/598, 599, 622; 257/773, 776
See application file for complete search history.

(56) References Cited

U.S. PATENT DOCUMENTS

| | | | |
|---|---|---|---|
| 3,566,214 A | 2/1971 | Usuda | |
| 3,577,037 A | 5/1971 | Di Pietro et al. | |
| 3,659,340 A | 5/1972 | Giedd et al. | |
| 4,259,367 A * | 3/1981 | Dougherty, Jr. | ........... 438/4 |
| 5,162,889 A | 11/1992 | Itomi | |

(Continued)

*Primary Examiner* — Mary Wilczewski
(74) *Attorney, Agent, or Firm* — Jacqueline J. Garner; Frank Cimino

(57) ABSTRACT

An integrated circuit may be formed by forming a first interconnect pattern in a first plurality of parallel route tracks, and forming a second interconnect pattern in a second plurality of parallel route tracks, in which the second plurality of route tracks are alternated with the first plurality of route tracks. The first interconnect pattern includes a first lead pattern and the second interconnect pattern includes a second lead pattern, such that the route track containing the first lead pattern is immediately adjacent to the route track containing the second lead pattern. Metal interconnect lines are formed in the first interconnect pattern and the second interconnect pattern. A stretch crossconnect is formed in a vertical connecting level, such as a via or contact level, which electrically connects only the first lead and the second lead. The stretch crossconnect is formed concurrently with other vertical interconnect elements.

1 Claim, 12 Drawing Sheets

(56) References Cited

U.S. PATENT DOCUMENTS

| | | | |
|---|---|---|---|
| 5,399,517 A * | 3/1995 | Ashtaputre et al. | 438/598 |
| 5,618,744 A * | 4/1997 | Suzuki et al. | 438/599 |
| 5,798,551 A | 8/1998 | Kikushima et al. | |
| 6,613,634 B2 | 9/2003 | Ootsuka et al. | |
| 7,190,031 B2 | 3/2007 | Chakihara et al. | |
| 7,477,125 B1 | 1/2009 | Lin et al. | |
| 7,573,097 B2 | 8/2009 | Desko et al. | |
| 7,592,247 B2 | 9/2009 | Yang et al. | |
| 7,777,263 B2 | 8/2010 | Nikaido et al. | |
| 8,372,743 B2 | 2/2013 | Blatchford | |
| 8,461,038 B2 | 6/2013 | Blatchford | |
| 8,580,675 B2 * | 11/2013 | Blatchford et al. | 438/622 |
| 2006/0277521 A1 * | 12/2006 | Chen et al. | 716/21 |
| 2007/0077523 A1 * | 4/2007 | Finders | 430/311 |
| 2007/0249157 A1 * | 10/2007 | Matsubara | 438/622 |
| 2008/0020296 A1 * | 1/2008 | Hsu et al. | 430/5 |
| 2010/0110654 A1 | 5/2010 | Wang | |
| 2012/0223439 A1 | 9/2012 | Blatchford et al. | |
| 2012/0225551 A1 | 9/2012 | Blatchford | |

* cited by examiner

US 9,024,450 B2

TWO-TRACK CROSS-CONNECT IN DOUBLE-PATTERNED STRUCTURE USING RECTANGULAR VIA

CROSS-REFERENCE TO RELATED APPLICATIONS

This application is a divisional of U.S. Nonprovisional patent application Ser. No. 13/410,241, filed Mar. 1, 2012, now U.S. Pat. No. 8,580,675, issued Nov. 12, 2013, and claims the benefit of priority under U.S.C. §119(e) of U.S. Provisional Application 61/448,423, filed Mar. 2, 2011).

The following applications are related and hereby incorporated by reference:

Patent application Ser. No. 13/410,236, entitled "TWO-TRACK CROSS-CONNECTS IN DOUBLE-PATTERNED METAL LAYERS USING A FORBIDDEN ZONE," now U.S. Pat. No. 8,461,038, issued Jun. 11, 2013.

Patent application Ser. No. 13/410,188 entitled "PATTERN-SPLIT DECOMPOSITION STRATEGY FOR DOUBLE-PATTERNED LITHOGRAPHY PROCESS," now U.S. Pat. No. 8,575,020, issued Nov. 5, 2013, and Patent application Ser. No. 13/410,145, filed Mar. 1, 2012) entitled "HYBRID PITCH-SPLIT PATTERN-SPLIT LITHOGRAPHY PROCESS", now U.S. Pat. No. 8,372,743, issued Feb. 12, 2013.

FIELD OF THE INVENTION

This invention relates to the field of integrated circuits. More particularly, this invention relates to photolithography processes for forming integrated circuits.

BACKGROUND OF THE INVENTION

Integrated circuits may be formed using photolithography processes with illuminations sources having wavelengths more than twice a desired pitch of metal interconnect lines in the integrated circuits. Attaining desired tradeoffs between fabrication costs and fabrication yield may be difficult. For example, technology nodes at and beyond the 28 nanometer node using 193 nanometer illumination sources may require more than one pattern step to obtain desired first metal interconnect layouts. Forming crossovers between adjacent parallel route tracks in the first metal level with desired lateral dimensions may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by a process of forming a first interconnect pattern in a first plurality of parallel route tracks, and forming a second interconnect pattern in a second plurality of parallel route tracks, in which the second plurality of route tracks are alternated with the first plurality of route tracks. The first interconnect pattern includes a first lead pattern in an instance of the first plurality of parallel route tracks, and the second interconnect pattern includes a second lead pattern in an instance of the second plurality of parallel route tracks, such that the first lead pattern is immediately adjacent to the second lead pattern. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. A stretch crossconnect is formed in a vertical connecting level, such as a via or contact level, which electrically connects the first lead and the second lead. The stretch crossconnect is not electrically connected to other interconnect elements other than the first lead and the second lead. The stretch crossconnect is formed concurrently with other vertical interconnect elements such as vias or contacts in the vertical connecting level.

DETAILED DESCRIPTION OF EXAMPLE EMBODIMENTS

Figure 1A:
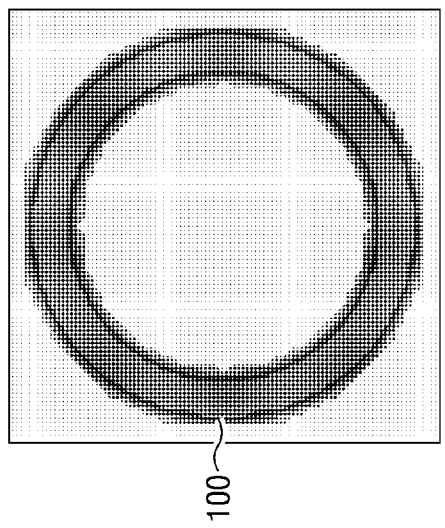
FIG. 1A through FIG. 1F depict exemplary illumination sources for photolithographic processes which may be used to form integrated circuits according to embodiments described herein.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by printing interconnect patterns for leads in parallel route tracks which have a pitch distance short enough to require a dipole illumination source and at least double patterning. Printing crossovers in a same interconnect level as the leads would result in the crossovers having lateral dimensions significantly larger than widths of the leads. The integrated circuit may therefore be formed by a process of forming a first interconnect pattern in a first plurality of parallel route tracks, and forming a second interconnect pattern in a second plurality of parallel route tracks, in which the second plurality of route tracks are alternated with the first plurality of route tracks. The first interconnect pattern includes a first lead pattern in an instance of the first plurality of parallel route tracks, and the second interconnect pattern includes a second lead pattern in an instance of the second plurality of parallel route tracks, such that the first lead pattern is immediately adjacent to the second lead pattern. A metal interconnect formation process is performed which forms metal interconnect lines in an interconnect level defined by the first interconnect pattern and the second interconnect pattern. A first lead and a second lead are formed by the metal interconnect formation process in an area defined by the first lead pattern and an area defined by the second lead pattern, respectively. A stretch crossconnect is formed in a vertical connecting level, such as a via or contact level, which electrically connects the first lead and the second lead. The stretch crossconnect is not electrically connected to other interconnect elements other than the first lead and the second lead. The stretch crossconnect is formed concurrently with other vertical interconnect elements such as vias or contacts in the vertical connecting level. Forming the crossconnect as such may advantageously reduce an area of the integrated circuit.

Figure 1B:
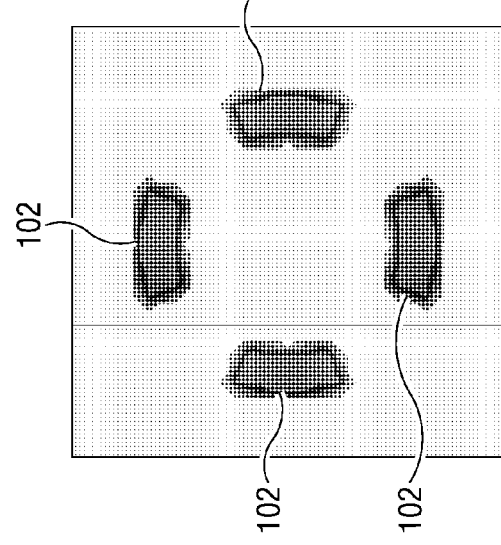
Figure 1C:
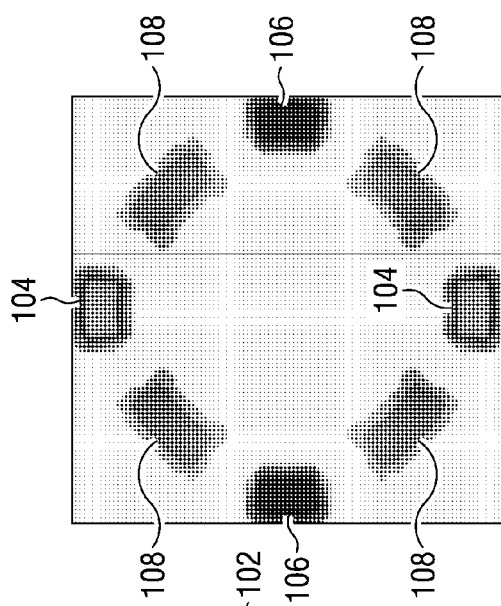
Figure 1D:
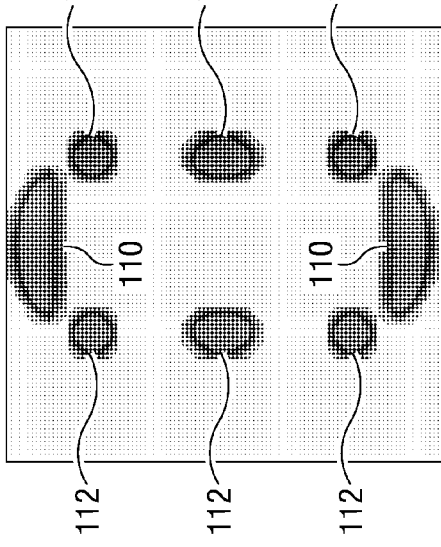
Figure 1E:
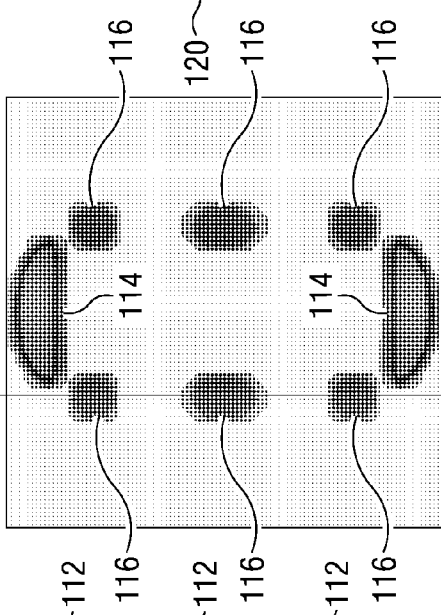
Figure 1F:
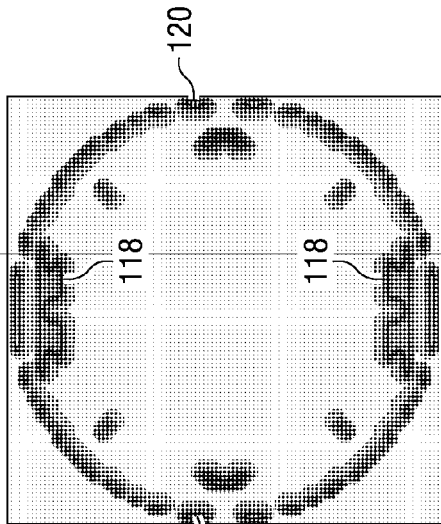

FIG. 1A through FIG. 1F depict exemplary illumination sources for photolithographic processes which may be used to form integrated circuits according to embodiments described herein. FIG. 1A depicts an isotropic off-axis illumination source, in which the emitting area 100 has an annular configuration. FIG. 1B depicts a quadruple off-axis illumination source, in which the emitting area 102 is configured in four regions uniformly spaced around an optical axis of the illumination source so as to provide substantially equal spatial resolution in both horizontal and vertical directions. FIG. 1C depicts a composite dipole-quadrupole-octopole off-axis illumination source, in which the emitting area is configured in two strong emitting regions 104 along the vertical direction, two moderate emitting regions 106 along the horizontal direction, and four weak emitting regions 108 along diagonal directions. FIG. 1D depicts an off-axis illumination source with a moderate dipole component; the emitting area is configured in two large dipole regions 110 along the vertical direction and smaller source regions 112 along the horizontal and diagonal directions. FIG. 1E depicts an off-axis illumination source with a strong dipole component; the emitting area is configured in two large dipole regions 114 along the vertical direction and smaller, weaker source regions 116 along the horizontal and diagonal directions. FIG. 1F depicts an off-axis illumination source with a dipole component; the emitting area is configured in two dipole regions 118 along the vertical direction and a distributed annular region 120.

Figure 2A:
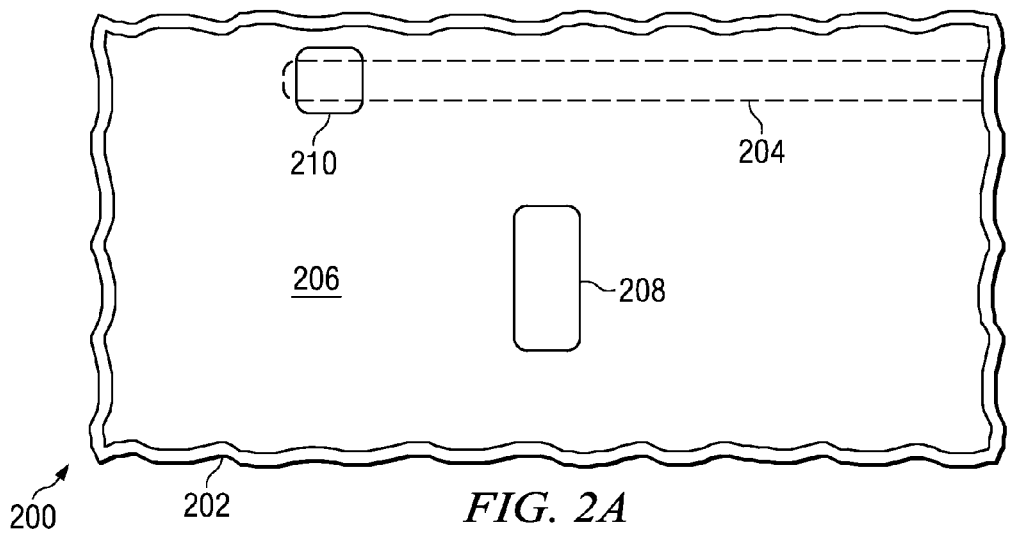
FIG. 2A through FIG. 2D are top views of an integrated circuit formed according a first embodiment, depicted in successive stages of fabrication.

FIG. 2A through FIG. 2D are top views of an integrated circuit formed according a first embodiment, depicted in successive stages of fabrication. Referring to FIG. 2A, the integrated circuit 200 is formed in and on a semiconductor substrate 202. An electrically conductive circuit element 204, such as an active area, an element of gate material, a local interconnect of damascened metal or a metal interconnect element, is formed in, on or over the substrate 202. The circuit element 204 may include a layer of metal silicide.

A dielectric layer stack 206 is formed over the substrate 202 and at least a portion of the dielectric layer stack 206 extends over the circuit element 204. The dielectric layer stack 206 may include, for example, a pre-metal dielectric (PMD) layer, and may further include an intra-metal dielectric (IMD) layer and an inter-level dielectric (ILD) layer.

A stretch crossconnect 208 and an inter-level interconnect element 210 are formed concurrently in the dielectric layer stack 206. In one version of the instant embodiment, the circuit element 204 may be disposed in or on the substrate 202 and the inter-level interconnect element 210 may be a contact. In another version, the circuit element 204 may be disposed above the substrate 202 and the inter-level interconnect element 210 may be a via. The inter-level interconnect element 210 makes electrical contact to the circuit element 204. The stretch crossconnect 208 is free of electrical connections to elements below the stretch crossconnect 208.

Figure 2B:
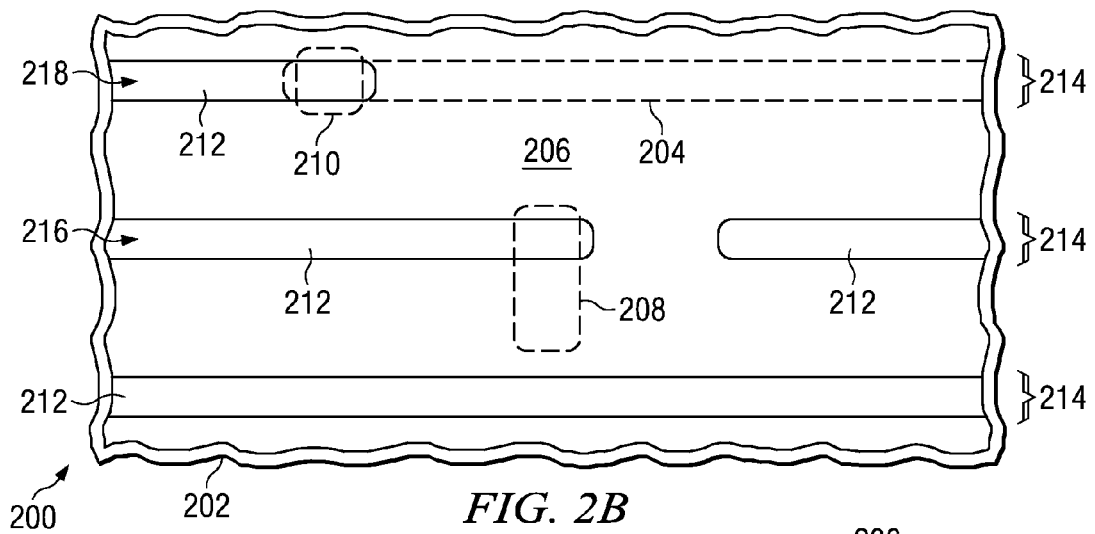

Referring to FIG. 2B, a first interconnect pattern 212 is formed over the integrated circuit 200 in a first plurality 214 of parallel route tracks. The first interconnect pattern 212 includes a first lead pattern 216 which extends over the stretch crossconnect 208. The first interconnect pattern 212 further includes a connecting element pattern 218 which extends over the inter-level interconnect element 210. The first interconnect pattern 212 may be maintained during a subsequent photolithographic operation.

Figure 2C:
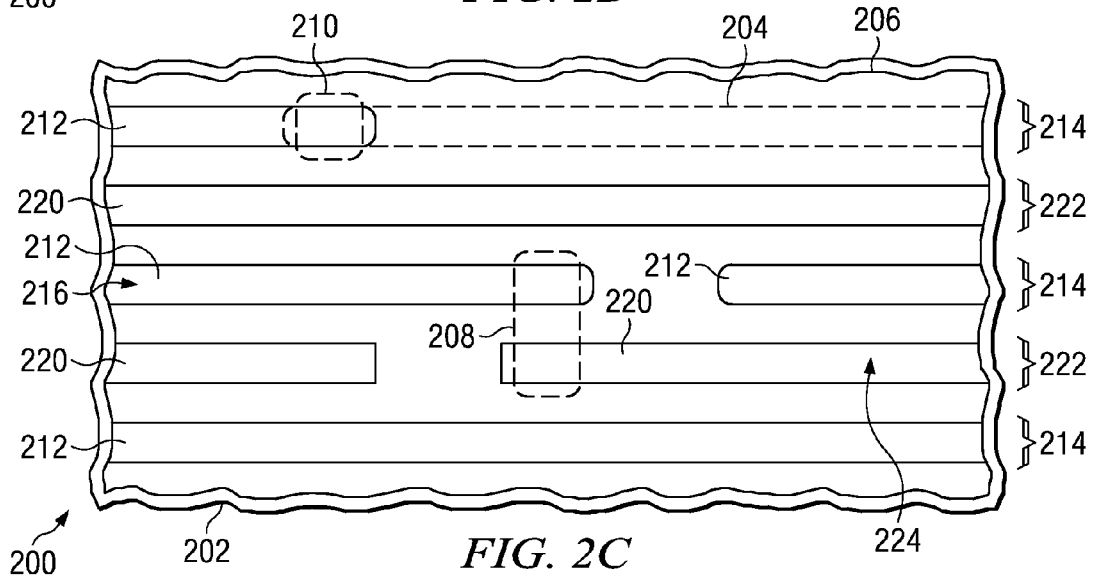

Referring to FIG. 2C, after forming the first interconnect pattern 212 and possibly with the first interconnect pattern 212 in place, a separate second interconnect pattern 220 is formed over the integrated circuit 200 in a second plurality 222 of parallel route tracks, in which the second plurality of route tracks 222 are alternated with the first plurality of route tracks 214. The second interconnect pattern 220 includes a second lead pattern 224 which extends over the stretch crossconnect 208. An instance of the first plurality 214 of parallel route tracks containing the first lead pattern 216 is immediately adjacent to an instance of the second plurality 222 of parallel route tracks containing the second lead pattern 224.

Figure 2D:
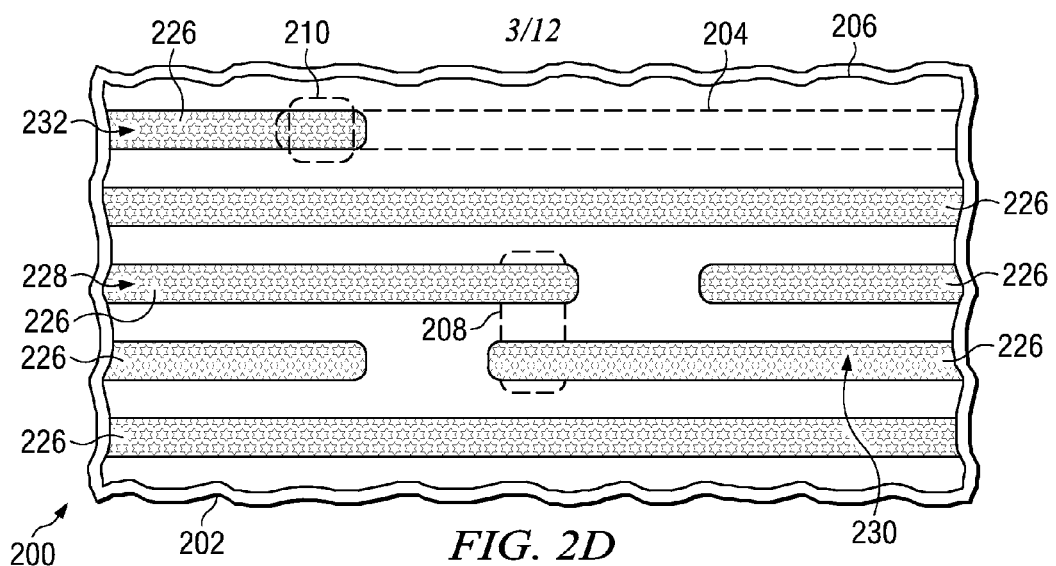

Referring to FIG. 2D, a metal interconnect formation process is performed which simultaneously forms metal interconnect lines 226 in an interconnect level defined by both the first interconnect pattern 212 and the second interconnect pattern 220. The metal interconnect lines 226 are depicted in FIG. 2D with a star hatch pattern. A first lead 228 and a second lead 230 are formed by the metal interconnect formation process in an area defined by the first lead pattern 216 and an area defined by the second lead pattern 224, respectively, so as to make electrical connections with the stretch crossconnect 208. The stretch crossconnect 208 is not electrically connected to other interconnect elements in the interconnect level other than the first lead 228 and the second lead 230. A connecting element 232 is formed by the metal interconnect formation process in an area defined by the connecting element pattern 218 so as to make electrical connections with the inter-level interconnect element 210.

Figure 3A:
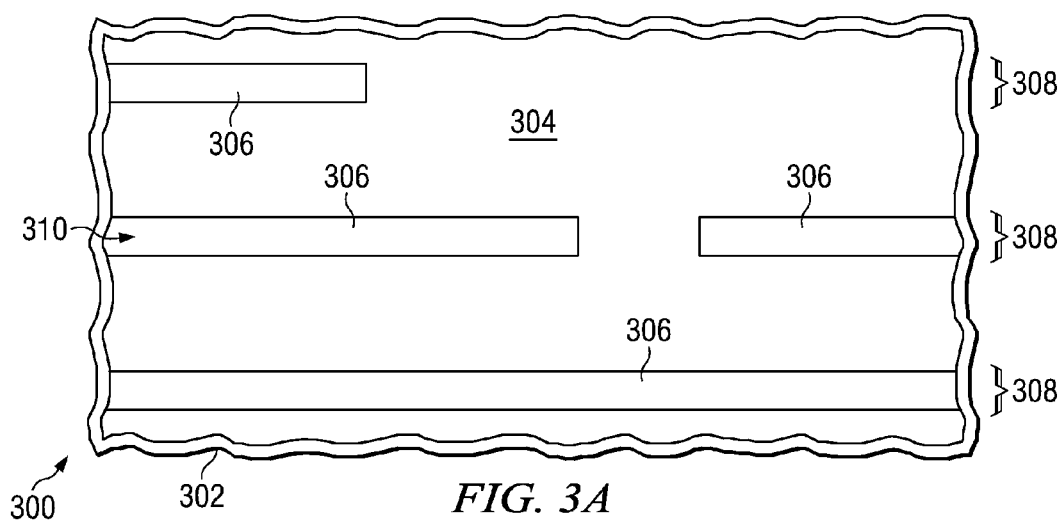
FIG. 3A through FIG. 3E are top views of an integrated circuit formed according a second embodiment, depicted in successive stages of fabrication.

FIG. 3A through FIG. 3E are top views of an integrated circuit formed according a second embodiment, depicted in successive stages of fabrication. Referring to FIG. 3A, the integrated circuit 300 is formed in and on a semiconductor substrate 302. A dielectric stack 304 including a PMD layer is formed over the substrate 302. The dielectric stack 304 may also include an IMD layer and an ILD layer. A first interconnect pattern 306 is formed over the integrated circuit 300 in a first plurality 308 of parallel route tracks. The first interconnect pattern 306 includes a first lead pattern 310. The first interconnect pattern 306 further includes a lower connecting element pattern 312. The first interconnect pattern 306 is maintained during a subsequent photolithographic operation.

Figure 3B:
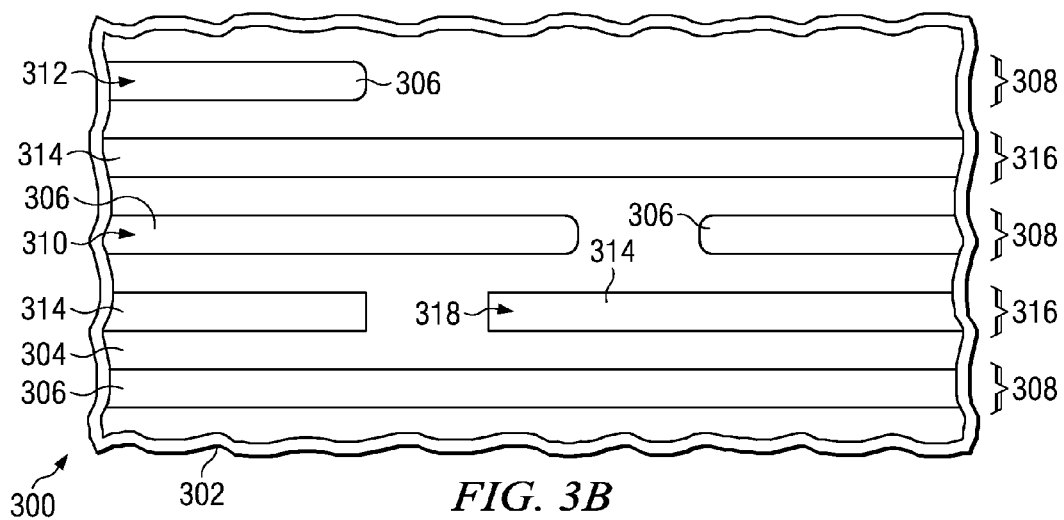

Referring to FIG. 3B, after forming the first interconnect pattern 306 and possibly with first interconnect pattern 306 remaining in place, a separate second interconnect pattern 314 is formed over the integrated circuit 300 in a second plurality 316 of parallel route tracks, in which the second plurality of route tracks 316 are alternated with the first plurality of route tracks 308. The second interconnect pattern 314 includes a second lead pattern 318. An instance of the first plurality 308 of parallel route tracks containing the first lead pattern 310 is immediately adjacent to an instance of the second plurality 316 of parallel route tracks containing the second lead pattern 318.

Figure 3C:
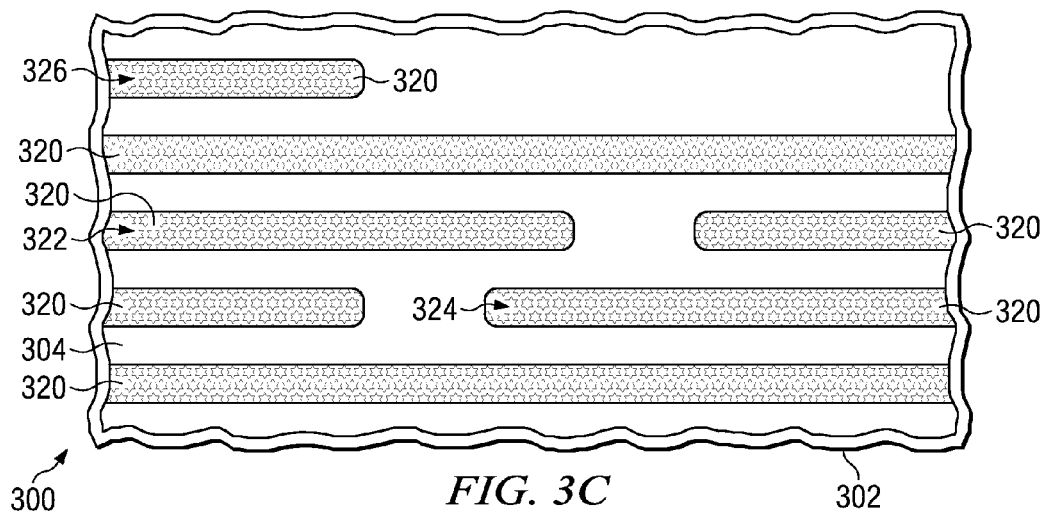

Referring to FIG. 3C, a metal interconnect formation process is performed which forms metal interconnect lines 320 in an interconnect level defined by the first interconnect pattern 306 and the second interconnect pattern 314. The metal interconnect lines 320 are depicted in FIG. 3C with a star hatch pattern. A first lead 322 and a second lead 324 are formed by the metal interconnect formation process in an area defined by the first lead pattern 310 and an area defined by the second lead pattern 318, respectively. A lower connecting element 326 is formed by the metal interconnect formation process in an area defined by the lower connecting element pattern 312.

Figure 3D:
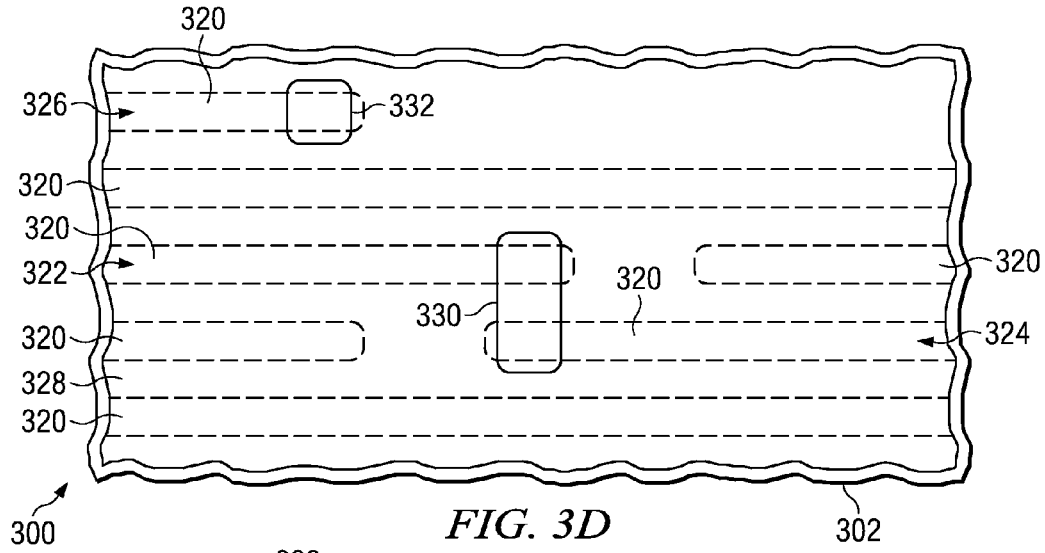

Referring to FIG. 3D, an ILD layer 328 is formed over the metal interconnect lines 320. A stretch crossconnect 330 and an inter-level interconnect element 332 are formed concurrently in the ILD layer 328. The stretch crossconnect 330 makes electrical contact to the first lead 322 and the second lead 324. In the instant embodiment, the inter-level interconnect element 332 may be a via.

Figure 3E:
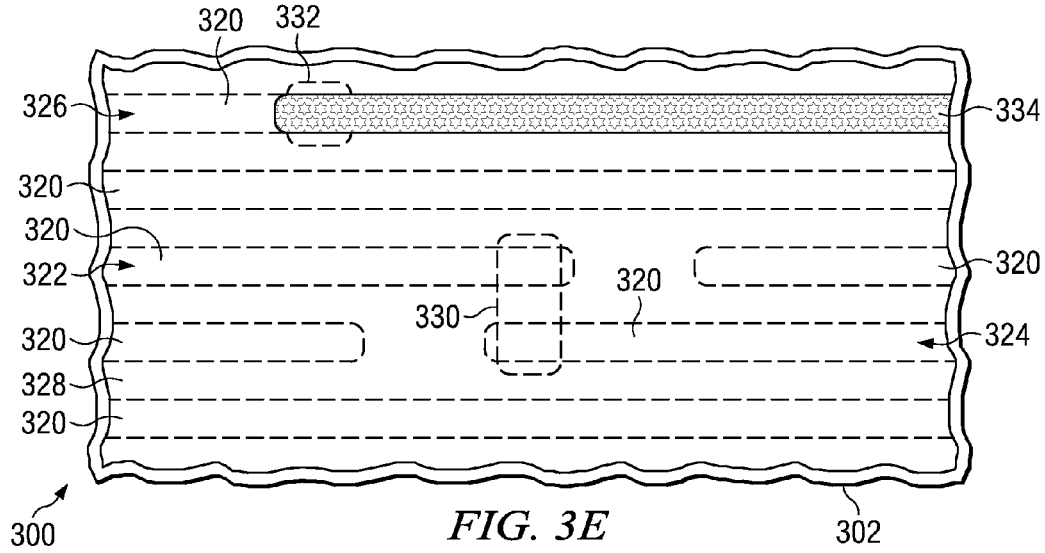

Referring to FIG. 3E, a metal upper connecting element 334 is formed on the ILD layer 328 so as to make electrical contact to the inter-level interconnect element 332. The upper connecting element 334 is depicted in FIG. 3E with a star hatch pattern. The stretch crossconnect 330 is free of electrical connections to elements above the stretch crossconnect 330.

Figure 4A:
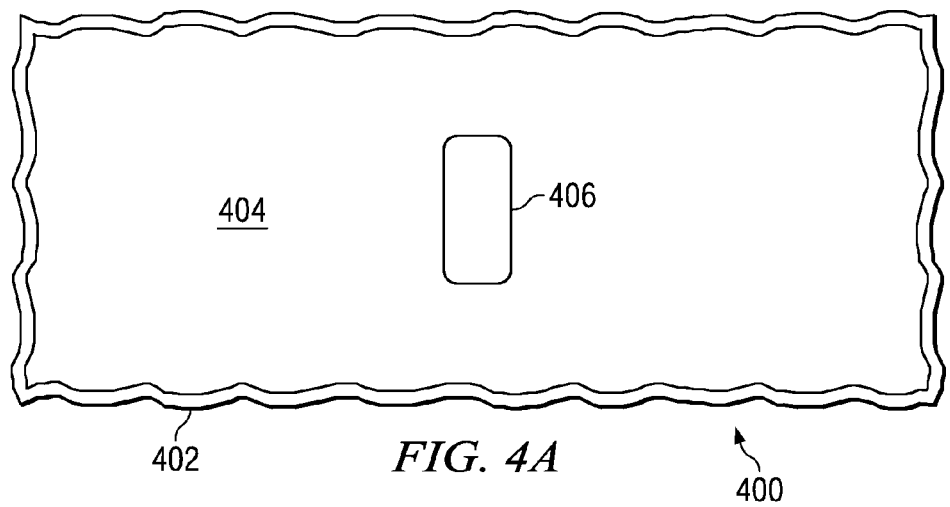
FIG. 4A through FIG. 4F are top views of an integrated circuit formed according the first embodiment using a damascene metal process, depicted in successive stages of fabrication.

FIG. 4A through FIG. 4F are top views of an integrated circuit formed according the first embodiment using a damascene metal process, depicted in successive stages of fabrication. Referring to FIG. 4A, the integrated circuit 400 is formed on a semiconductor substrate 402, which may be, for example, a single crystal silicon wafer, a silicon wafer with silicon-germanium regions, a silicon-on-insulator (SOI) wafer, a hybrid orientation technology (HOT) wafer with regions of different crystal orientations, a silicon wafer with a gallium nitride (GaN) epitaxial layer, or other material appropriate for fabrication of the integrated circuit 400. A PMD layer 404 is formed over the substrate 402. The PMD layer 206 may include, for example, a PMD liner, a PMD main layer, and an optional PMD cap layer. The PMD liner may be silicon nitride or silicon dioxide, 10 to 100 nanometers thick, deposited by PECVD on the existing top surface of the substrate. The PMD main layer may be a layer of silicon dioxide formed by a high aspect ratio process (HARP) followed by a layer of silicon dioxide, phospho-silicate glass (PSG) or boro-phospho-silicate glass (BPSG), commonly 100 to 1000 nanometers thick, deposited by a plasma enhanced chemical vapor deposition (PECVD) process on a top surface of the PMD liner, and sometimes leveled by a chemical-mechanical polish (CMP) process. The optional PMD cap layer may be 10 to 100 nanometers of a hard material such as silicon nitride, silicon carbide nitride or silicon carbide, formed on a top surface of the PMD main layer.

A stretch crossconnect 406 is formed in the PMD layer 404, for example by a process of defining a crossconnect area on a top surface of the PMD layer 404 with a photoresist pattern, etching a crossconnect hole in the crossconnect area by removing dielectric material using a reactive ion etching (RIE) process, and filling the crossconnect hole with a metal liner, such as titanium and titanium nitride, and a fill metal, such as tungsten, followed by removal of the fill metal and the liner metal from the top surface of the PMD layer 404 using plasma etching and/or CMP methods. The stretch crossconnect 406 is formed concurrently with inter-level interconnect elements in the integrated circuit 400.

Figure 4B:
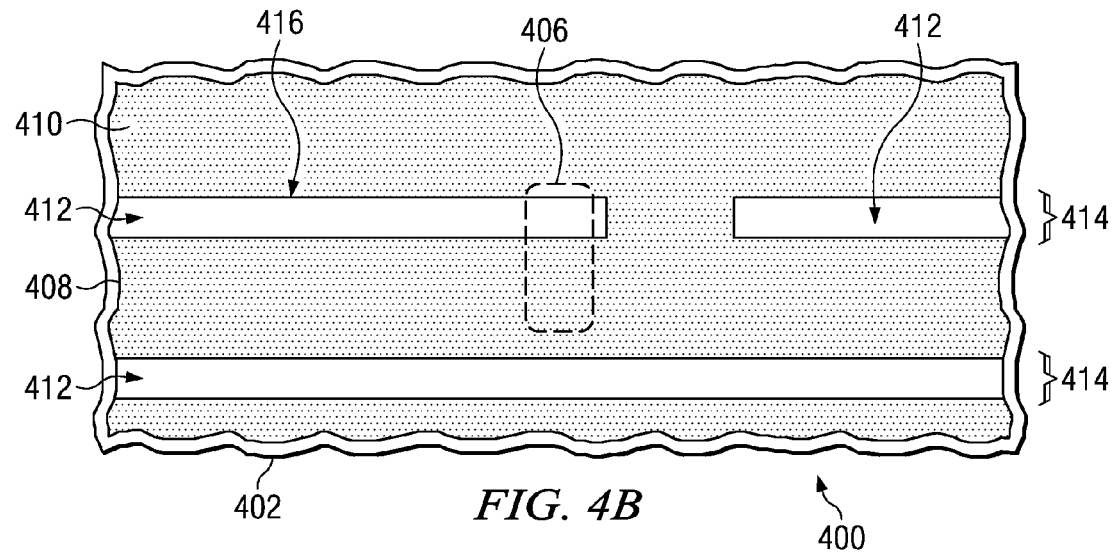

Referring to FIG. 4B, an IMD layer 408 is formed over the PMD layer 404 and the stretch crossconnect 406. The IMD layer 408 may include, for example, an etch stop layer of 5 to 25 nanometers of silicon nitride, silicon carbide, or silicon carbide nitride, a main layer of 100 to 200 nanometers of low-k dielectric material such as organo-silicate glass (OSG), carbon-doped silicon oxides (SiCO or CDO) or dielectric material formed from methylsilsesquioxane (MSQ), or possibly ultra low-k dielectric material such as porous OSG (p-OSG), and a cap layer of 10 to 40 nanometers of silicon nitride, silicon carbide nitride or silicon carbide.

A first interconnect pattern 410, depicted in FIG. 4B with a stipple pattern, is formed of photoresist over the IMD layer 408 which includes a first plurality of exposed areas 412 in a first plurality 414 of parallel route tracks. The first plurality of exposed areas 412 includes a first lead pattern 416 which extends over the stretch crossconnect 406. In one version of the instant embodiment, the first interconnect pattern 410 may be formed of novolak resin based photoresist and developed using a positive tone develop process such as exposure to an alkaline aqueous developing solution. In another version, the first interconnect pattern 410 may be formed of photoresist and developed using a negative tone develop process.

Figure 4C:
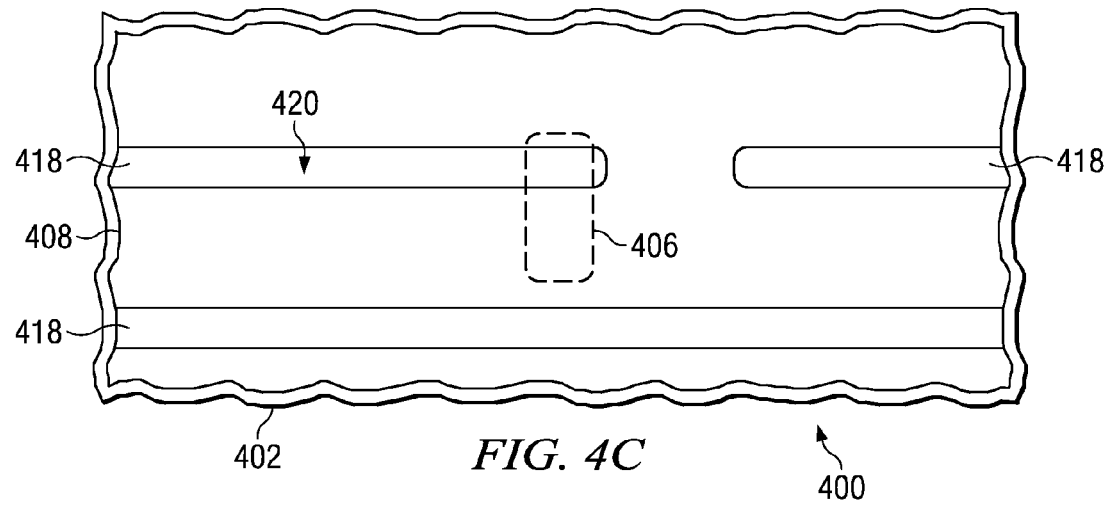

Referring to FIG. 4C, a first interconnect trench etch process is performed which removes dielectric material from the IMD layer 408 in the first plurality of exposed areas 412 to form a first plurality of interconnect trenches 418. A first lead trench 420 is formed by the first interconnect trench etch process in the first lead pattern 416. A portion of a top surface of the stretch crossconnect 406 is exposed by the first interconnect trench etch process in the first lead trench 420. The first interconnect pattern 410 is removed after the first interconnect trench etch process is completed, for example by exposing the integrated circuit 400 to an oxygen containing plasma, followed by a wet cleanup to remove any organic residue from the top surface of the IMD layer 408.

Figure 4D:
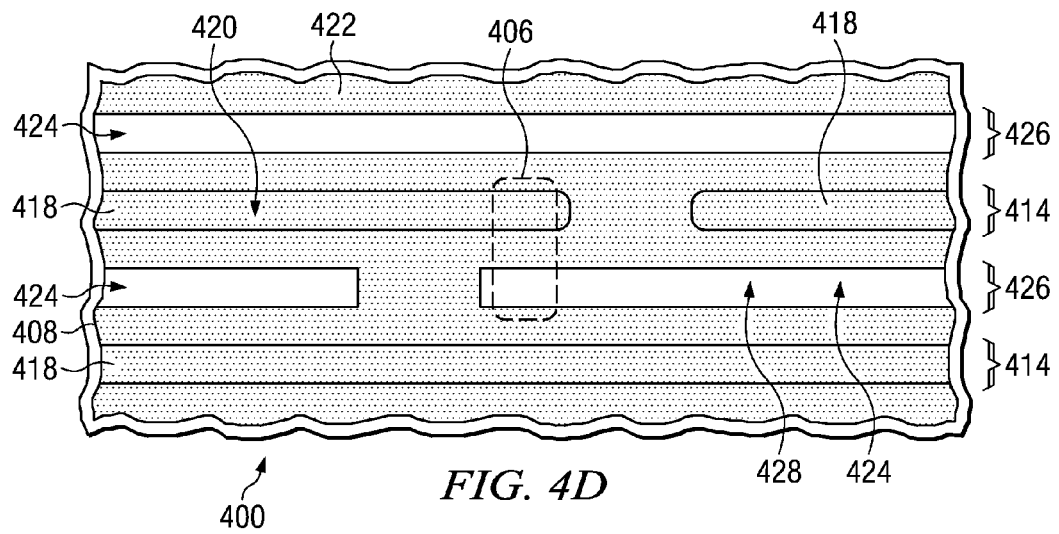

Referring to FIG. 4D, a second interconnect pattern 422, depicted in FIG. 4D with a stipple pattern, is formed of photoresist over the IMD layer 408 which includes a second plurality of exposed areas 424 in a second plurality 426 of parallel route tracks, in which the second plurality of route tracks 426 are alternated with the first plurality of route tracks 414. The second plurality of exposed areas 424 includes a second lead pattern 428 which extends over the stretch crossconnect 406. An instance of the first plurality 414 of parallel route tracks containing the first lead pattern 416 is immediately adjacent to an instance of the second plurality 426 of parallel route tracks containing the second lead pattern 428.

Figure 4E:
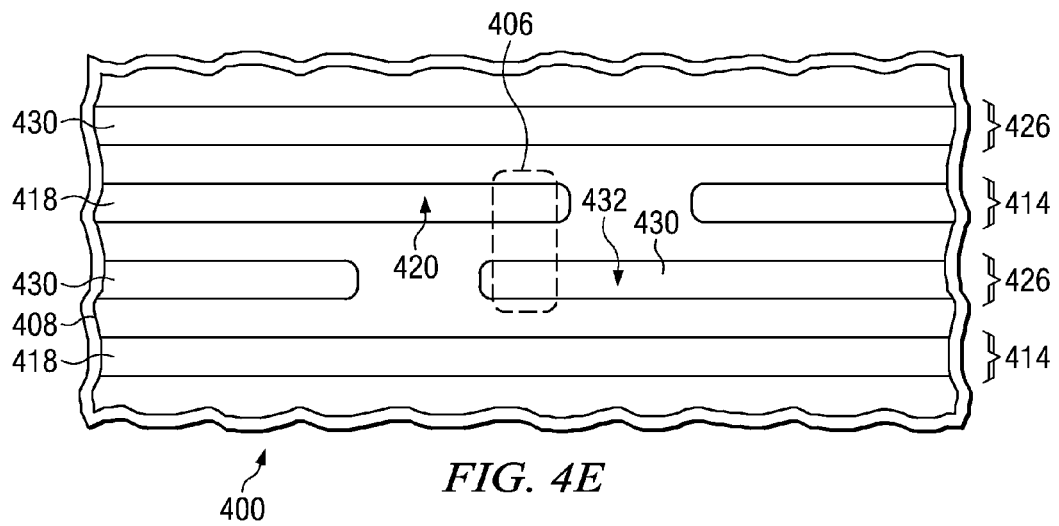

Referring to FIG. 4E, a second interconnect trench etch process is performed which removes dielectric material from the IMD layer 408 in the second plurality of exposed areas 424 to form a second plurality of interconnect trenches 430. A second lead trench 432 is formed by the second interconnect trench etch process in the second lead pattern 428. A portion of the top surface of the stretch crossconnect 406 is exposed by the second interconnect trench etch process in the second lead trench 432. The second interconnect pattern 422 is removed after the second interconnect trench etch process is completed, for example as described in reference to FIG. 4C.

Figure 4F:
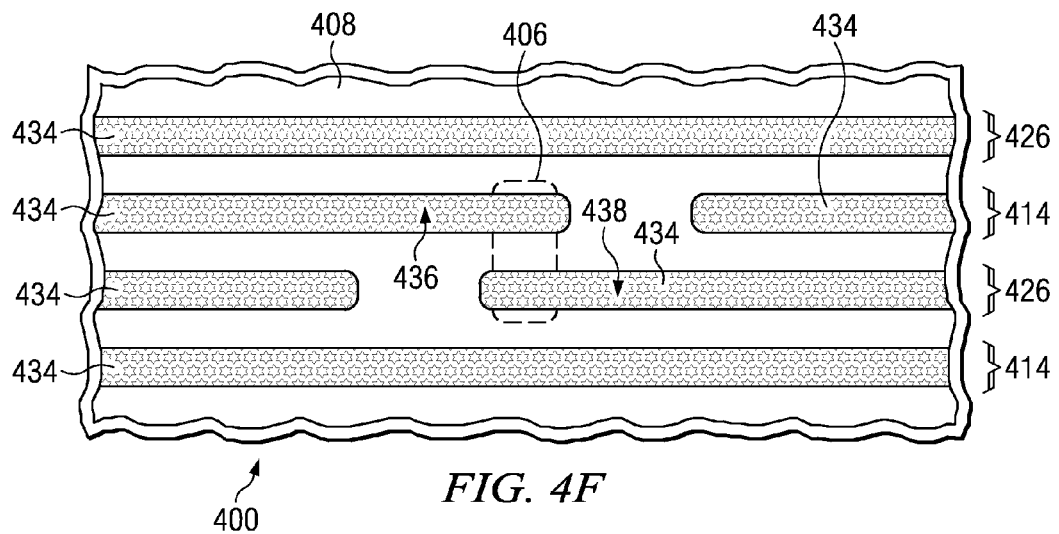

Referring to FIG. 4F, a damascene metal interconnect formation process is performed which forms metal interconnect lines 434 in both the first plurality of interconnect trenches 418 and the second plurality of interconnect trenches 430. The metal interconnect lines 434 are depicted in FIG. 4F with a star hatch pattern. The damascene metal interconnect formation process may include, for example, forming a metal liner such as a tantalum nitride liner 1 to 5 nanometers thick in the interconnect trenches 418 and 430 by an atomic layer deposition (ALD) process, forming a copper seed layer 5 to 80 nanometers thick on the liner by sputtering, electroplating copper on the seed layer so as to fill the interconnect trenches 418 and 430, and subsequently removing copper and liner metal from a top surface of the IMD layer 408 by a copper CMP process.

The metal interconnect lines 434 are disposed in an interconnect level of the integrated circuit 400 defined by the first interconnect pattern 410 and the second interconnect pattern 422. A first lead 436 and a second lead 438 are formed by the damascene metal interconnect formation process in an area defined by the first lead pattern 416 and an area defined by the second lead pattern 428, respectively, so as to make electrical connections with the stretch crossconnect 406. The stretch crossconnect 406 is not electrically connected to other interconnect elements in the interconnect level other than the first lead 436 and the second lead 438.

In one version of the instant embodiment, in which a via-first dual damascene process flow is used, the IMD layer 408 may be formed before the stretch crossconnect 406 is formed. The stretch crossconnect 406 may be formed by forming an etch mask over the IMD layer 408 to expose an area for the stretch crossconnect 406, removing material from the IMD layer 408 and possibly the PMD layer 404 using an RIE process, and possibly filling the etched area with a sacrificial material such as photoresist. The via-first process flow continues with the steps described reference to FIG. 4B. Metal is formed in the stretch crossconnect 406 concurrently with the first plurality of interconnect trenches 418 and the second plurality of interconnect trenches 430 as described in reference to FIG. 4F.

Figure 5A:
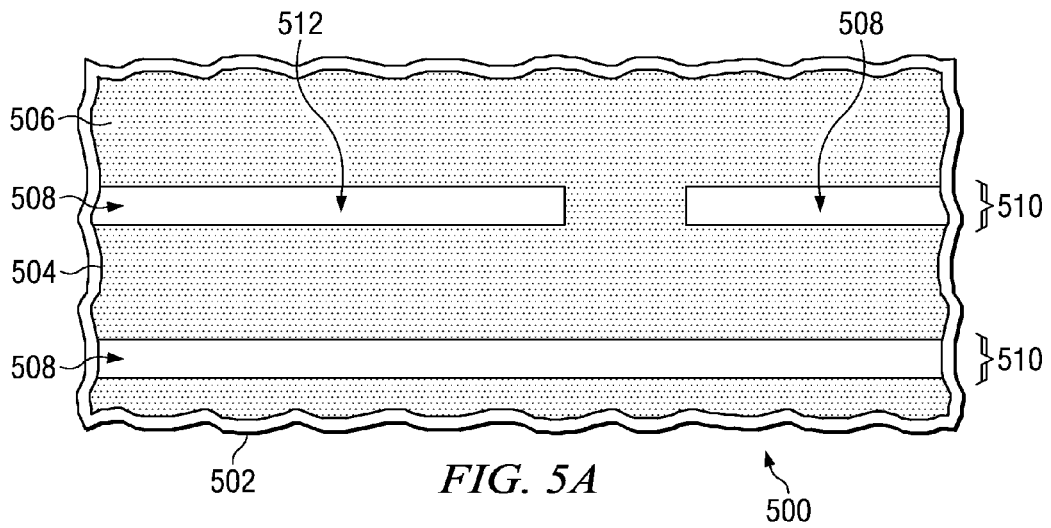
FIG. 5A through FIG. 5F are top views of an integrated circuit formed according the second embodiment using a damascene metal process, depicted in successive stages of fabrication.

FIG. 5A through FIG. 5F are top views of an integrated circuit formed according the second embodiment using a damascene metal process, depicted in successive stages of fabrication. Referring to FIG. 5A, the integrated circuit 500 is formed on a semiconductor substrate 502, for example as described in reference to FIG. 4A. A dielectric stack 504 including a PMD layer and an IMD layer is formed over the substrate 502. The dielectric stack 504 may also include an ILD layer and a second IMD layer.

A first interconnect pattern 506, depicted with a stipple pattern, is formed of photoresist over the dielectric stack 504 which includes a first plurality of exposed areas 508 in a first plurality 510 of parallel route tracks. The first plurality of exposed areas 508 includes a first lead pattern 512. The first interconnect pattern 506 may be formed as described in reference to FIG. 4B.

Figure 5B:
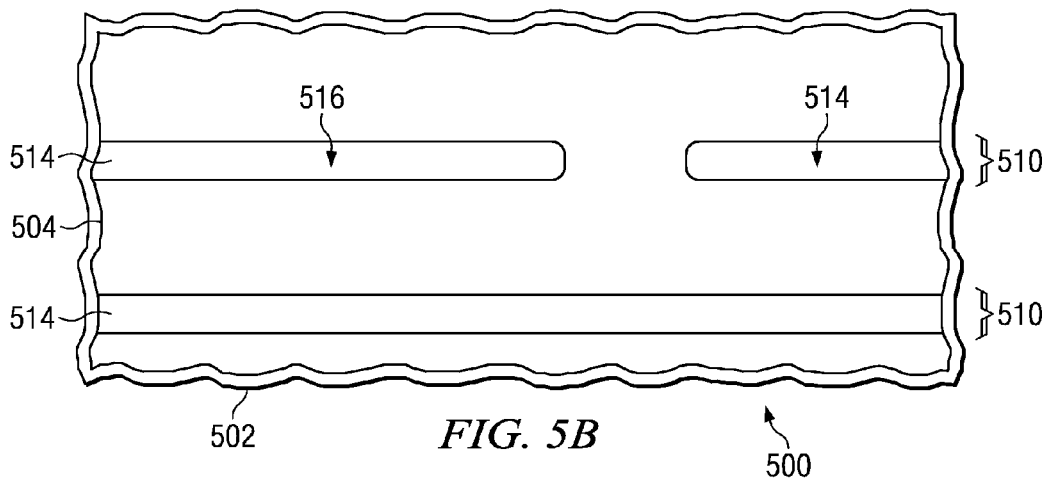

Referring to FIG. 5B, a first interconnect trench etch process is performed which removes dielectric material from the dielectric stack 504 in the first plurality of exposed areas 508 to form a first plurality of interconnect trenches 514. A first lead trench 516 is formed by the first interconnect trench etch process in the first lead pattern 512. The first interconnect pattern 506 is removed after the first interconnect trench etch process is completed, for example as described in reference to FIG. 4C.

Figure 5C:
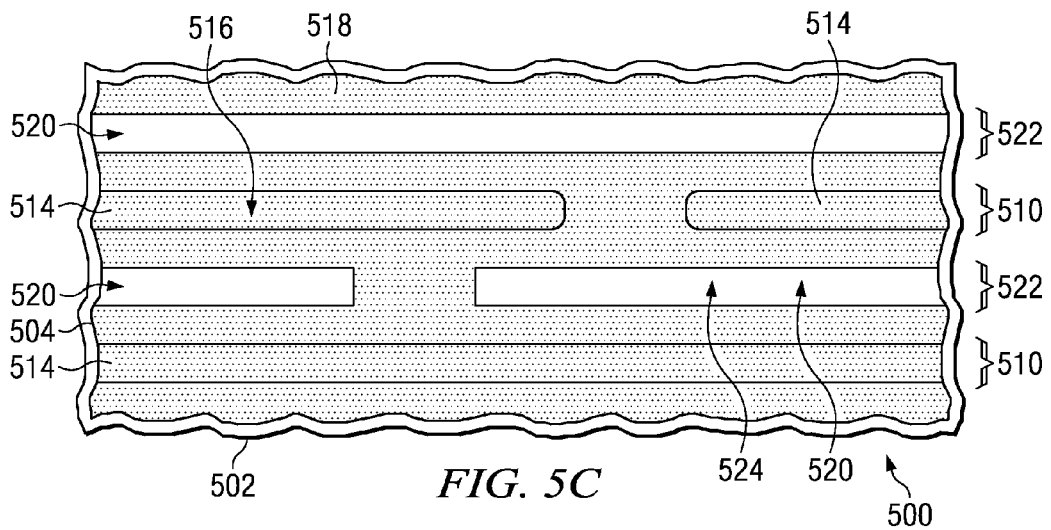

Referring to FIG. 5C, a second interconnect pattern 518, depicted with a stipple pattern, is formed of photoresist over the dielectric stack 504 which includes a second plurality of exposed areas 520 in a second plurality 522 of parallel route tracks, in which the second plurality of route tracks 522 are alternated with the first plurality of route tracks 510. The second plurality of exposed areas 520 includes a second lead pattern 524. An instance of the first plurality 510 of parallel route tracks containing the first lead pattern 512 is immediately adjacent to an instance of the second plurality 522 of parallel route tracks containing the second lead pattern 524.

Figure 5D:
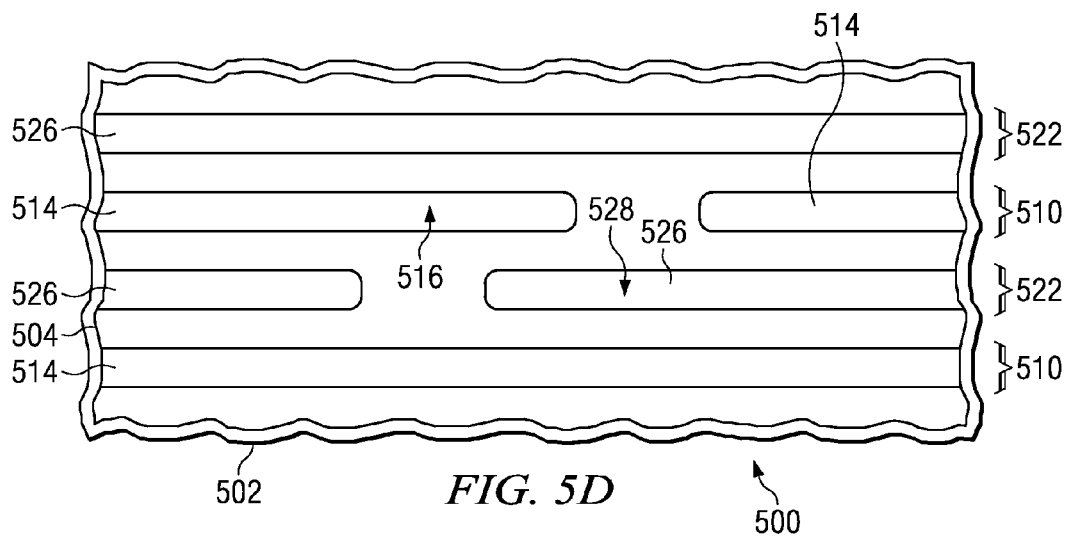

Referring to FIG. 5D, a second interconnect trench etch process is performed which removes dielectric material from the dielectric stack 504 in the second plurality of exposed areas 520 to form a second plurality of interconnect trenches 526. A second lead trench 528 is formed by the second interconnect trench etch process in the second lead pattern 524. The second interconnect pattern 518 is removed after the second interconnect trench etch process is completed, for example as described in reference to FIG. 4C.

Figure 5E:
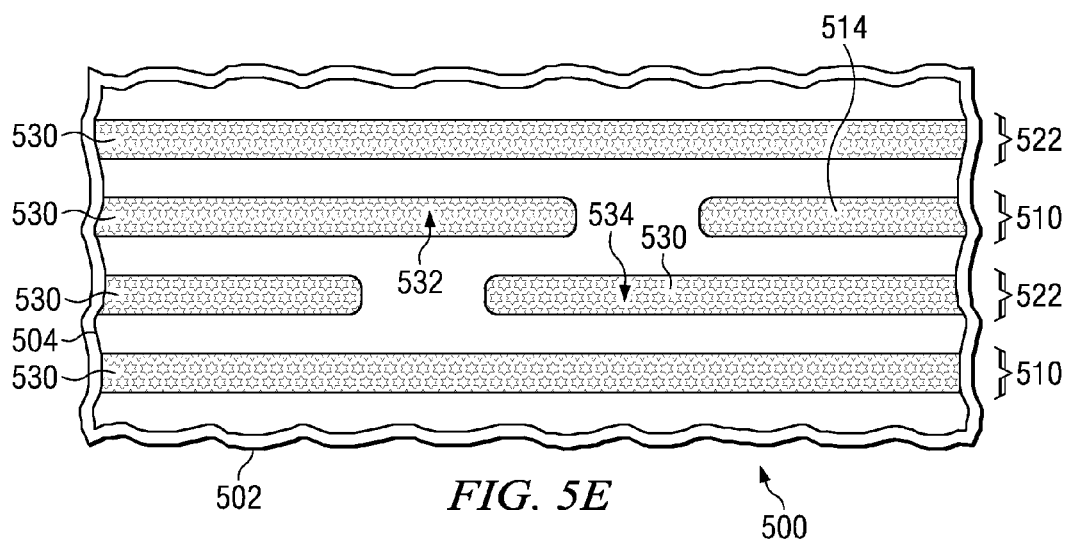

Referring to FIG. 5E, a damascene metal interconnect formation process is performed which forms metal interconnect lines 530 in both the first plurality of interconnect trenches 514 and the second plurality of interconnect trenches 526, for example as described in reference to FIG. 4F. The metal interconnect lines 530 are depicted in FIG. 5E with a star hatch pattern. The metal interconnect lines 530 are disposed in an interconnect level of the integrated circuit 500 defined by the first interconnect pattern 506 and the second interconnect pattern 518. A first lead 532 and a second lead 534 are formed by the damascene metal interconnect formation process in an area defined by the first lead pattern 512 and an area defined by the second lead pattern 524, respectively.

Figure 5F:
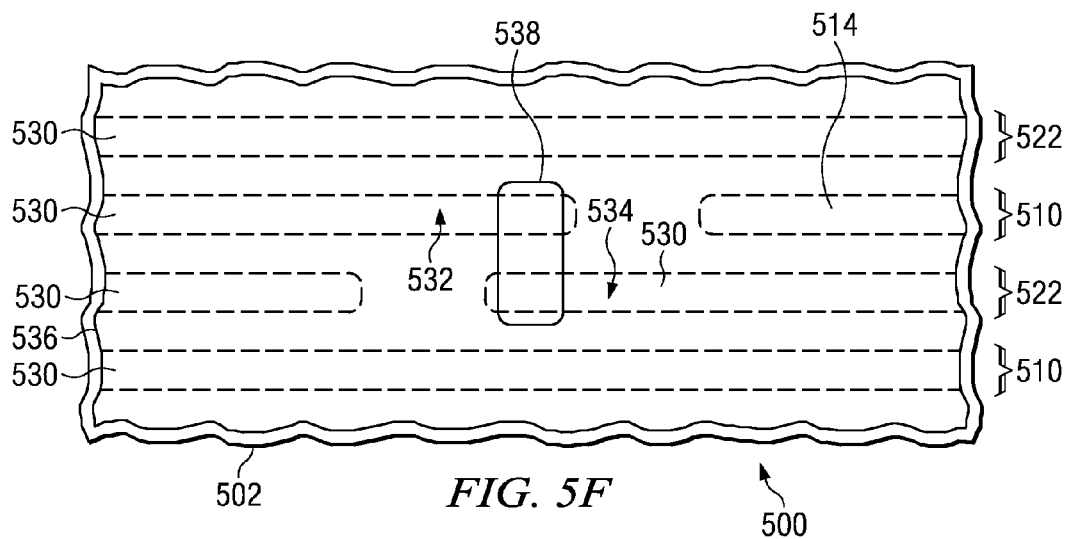

Referring to FIG. 5F, an ILD layer 536 is formed over the dielectric stack 504 and the metal interconnect lines 530. The ILD layer 536 may include, for example, one or more etch stop layers, a main layer of low-k or ultra low-k dielectric material, and possibly an optional cap layer. A stretch crossconnect 538 is formed in the ILD layer 536, so as to make electrical contact to the first lead 532 and the second lead 534. The stretch crossconnect 538 is formed concurrently with inter-level interconnect elements in the integrated circuit 500. The stretch crossconnect 538 is free of electrical connections to elements above the stretch crossconnect 538.

In one version of the instant embodiment, the stretch crossconnect 538 may be formed as described in reference to FIG. 4A. In another version, the stretch crossconnect 538 may be formed by a single damascene copper process similar to the process used to form the metal interconnect lines 530.

In another version, the stretch crossconnect 538 may be formed by a trench-first self-aligned-via dual damascene copper process, including the steps of forming a hard mask layer over the ILD layer 536, forming a trench etch mask over the hard mask layer so as to expose areas for a second level of metal interconnect lines and an area for the stretch crossconnect 538, removing hard mask material and material from the ILD layer 536 in areas exposed by the trench etch mask, including the area for the stretch crossconnect 538, to form a second level of interconnect trenches and a crossconnect trench. Subsequently, a via etch mask may be formed over the hard mask layer so as to expose areas for vias, including the stretch crossconnect 538. The via etch mask may be oversized with respect to etched areas of the hard mask, so as to expose the hard mask layer adjacent to the via areas. A via etch process is performed which removes material from the ILD layer 536 in areas exposed by the via etch mask and the hard mask layer, including the area for the stretch crossconnect 538. Interconnect metal is formed in the second level of interconnect trenches and the area for the stretch crossconnect 538 by a damascene process, for example, as described in reference to FIG. 4F, forming a metal liner, forming a copper seed layer on the liner, electroplating copper on the seed layer, and removing copper and liner metal from a top surface of the ILD layer 536. Interconnect metal in the stretch crossconnect 538 may extend to a top surface of the second level of interconnects.

In a further version of the instant embodiment, the stretch crossconnect 538 may be formed by a via-first dual damascene copper process, including the steps of forming a via etch mask over the ILD layer 536, performing a via etch process which removes material from the ILD layer 536 in areas exposed by the via etch mask, including the area for the stretch crossconnect 538, and subsequently forming a trench etch mask over the ILD layer 536, and performing a trench etch process which removes material from the ILD layer 536 in areas exposed by the trench etch mask, including a second level of interconnect trenches and the area for the stretch crossconnect 538. Interconnect metal is formed in the second level of interconnect trenches and the area for the stretch crossconnect 538 by a damascene process, for example, as described in reference to FIG. 4F. Interconnect metal in the stretch crossconnect 538 may extend to a top surface of the second level of interconnects.

Figure 6A:
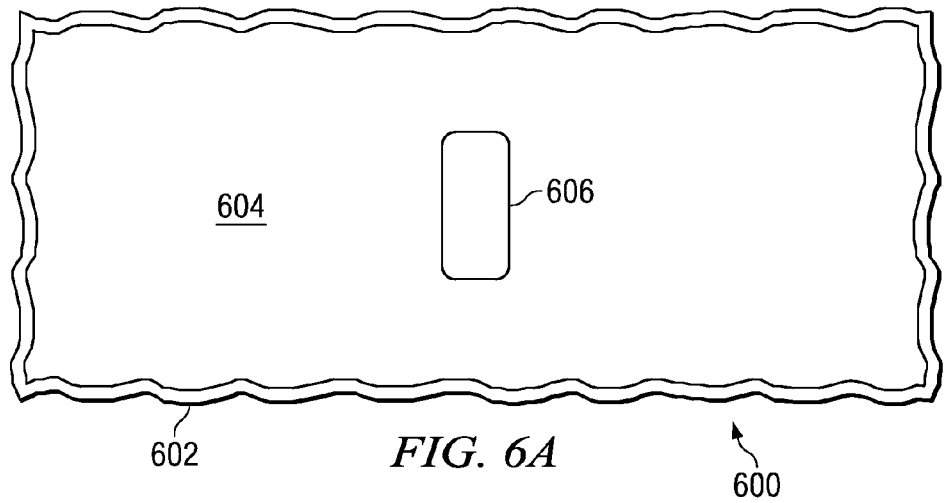
FIG. 6A through FIG. 6E are top views of an integrated circuit formed according the first embodiment using an etch-defined metal process, depicted in successive stages of fabrication.

FIG. 6A through FIG. 6E are top views of an integrated circuit formed according the first embodiment using an etch-defined metal process, depicted in successive stages of fabrication. Referring to FIG. 6A, the integrated circuit 600 is formed on a semiconductor substrate 602, and a PMD layer 604 is formed over the substrate 602, for example as described in reference to FIG. 4A.

A stretch crossconnect 606 is formed in the PMD layer 604, for example as described in reference to FIG. 4A. The stretch crossconnect 606 is formed concurrently with inter-level interconnect elements in the integrated circuit 600.

Figure 6B:
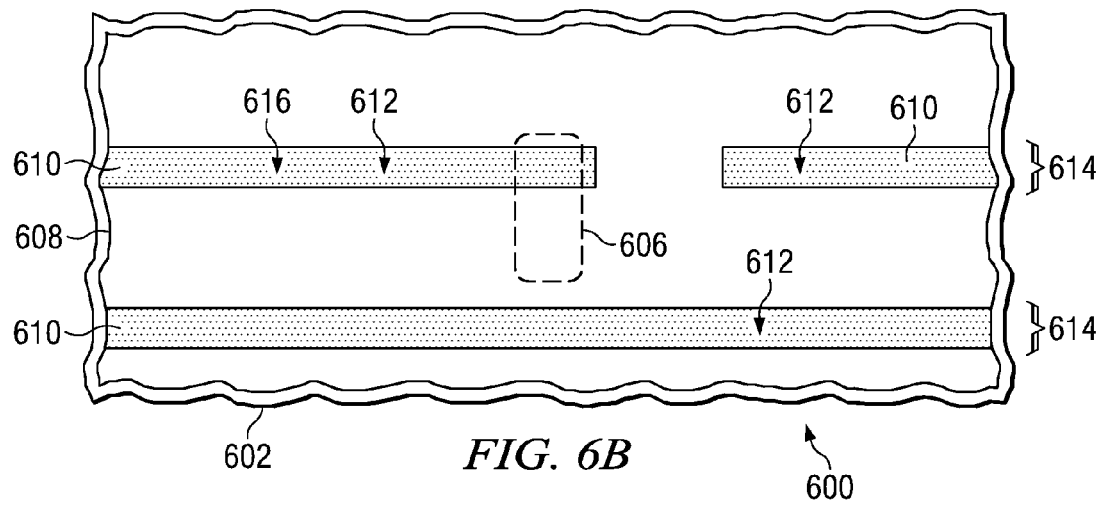

Referring to FIG. 6B, an interconnect metal layer 608 is formed over the PMD layer 604 and the stretch crossconnect 606. The interconnect metal layer 608 may include, for example, a metal adhesion layer of titanium tungsten or titanium nitride 3 to 15 nanometers thick formed by a metal organic chemical vapor deposition (MOCVD) process, a sputtered aluminum layer with 0.5 to 2 percent copper, silicon and/or titanium 100 to 200 nanometers thick, and a metal cap layer of, for example, 5 to 20 nanometers thick formed by an MOCVD process. The interconnect metal layer 608 makes electrical contact to the stretch crossconnect 606.

A first interconnect pattern 610, depicted in FIG. 6B with a stipple pattern, is formed of photoresist over the interconnect metal layer 608 which includes a first plurality of masked areas 612 in a first plurality 614 of parallel route tracks. The first plurality of masked areas 612 includes a first lead pattern 616 which extends over the stretch crossconnect 606. The first interconnect pattern 610 may be formed using a positive tone develop process or a negative tone develop process, as described in reference to FIG. 4B.

Figure 6C:
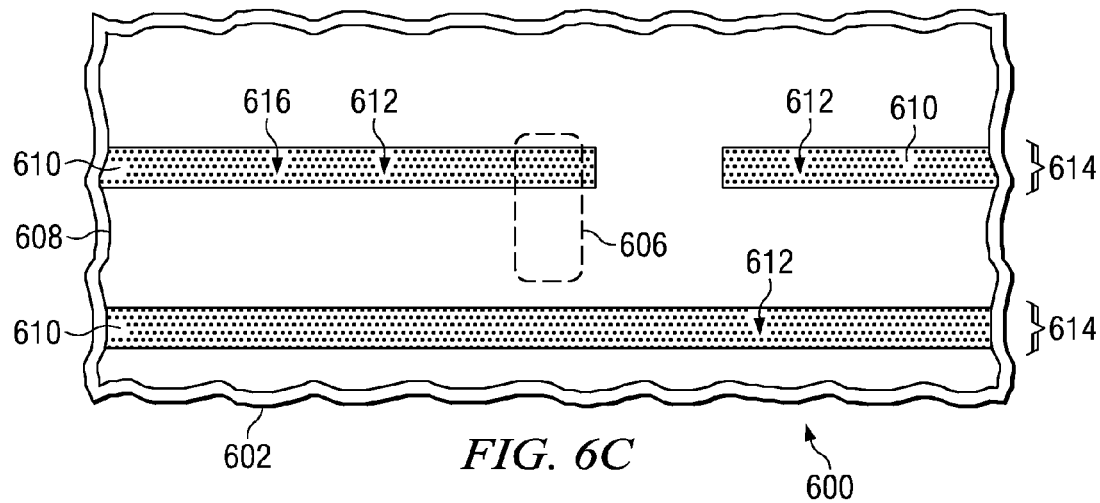

Referring to FIG. 6C, a resist freeze process is performed which hardens the first interconnect pattern 610 so as to allow a second photoresist pattern to be formed on the interconnect metal layer 608. The first interconnect pattern 610 after completion of the resist freeze process is depicted in FIG. 6C with a coarse stipple pattern. The litho freeze process may include, for example, an ultraviolet (UV) cure step, a thermal cure step and/or a chemical cure step.

Figure 6D:
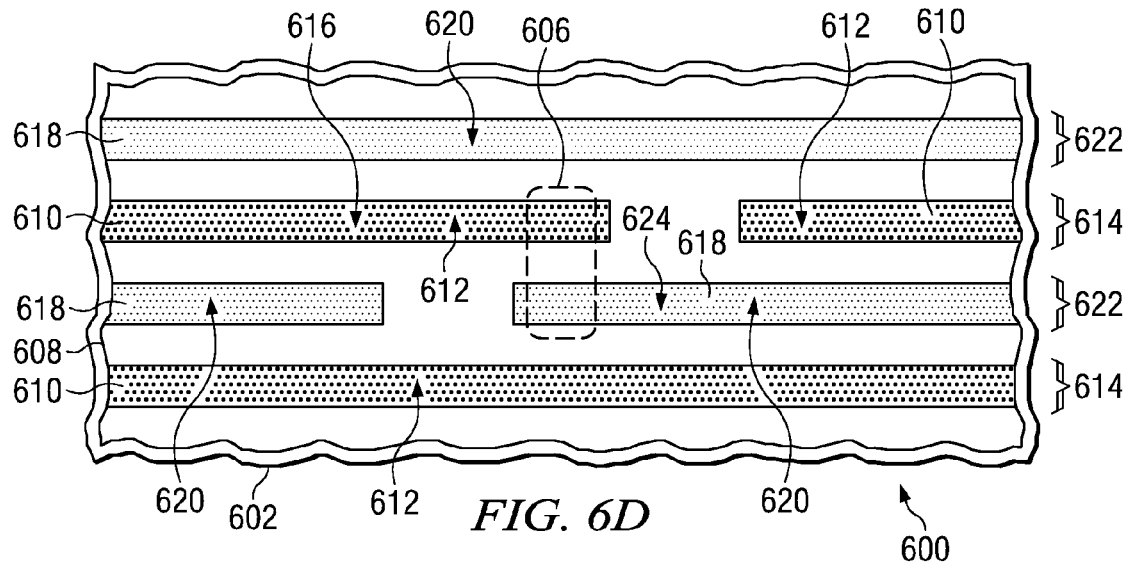

Referring to FIG. 6D, a separate second interconnect pattern 618, depicted in FIG. 6D with a stipple pattern, is formed of photoresist over the interconnect metal layer 608 which includes a second plurality of masked areas 620 in a second plurality 622 of parallel route tracks, in which the second plurality of route tracks 622 are alternated with the first plurality of route tracks 614. The second plurality of masked areas 620 includes a second lead pattern 624 which extends over the stretch crossconnect 606. An instance of the first plurality 614 of parallel route tracks containing the first lead pattern 616 is immediately adjacent to an instance of the second plurality 622 of parallel route tracks containing the second lead pattern 624.

Figure 6E:
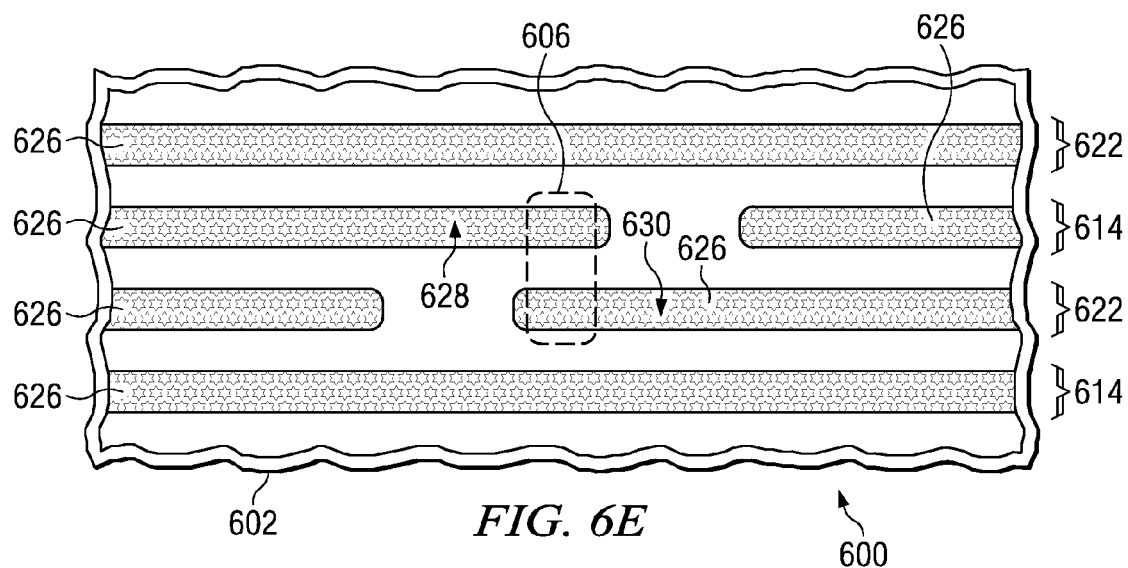

Referring to FIG. 6E, a metal etch process is performed which removes metal from the interconnect metal layer 608 outside of the first interconnect pattern 610 and the second interconnect pattern 618 so as to form metal interconnect lines 626. The metal interconnect lines 626 are depicted in FIG. 6E with a star hatch pattern. The metal etch process may include, for example an RIE step with a chlorine-containing plasma to etch the aluminum.

The metal interconnect lines 626 are disposed in an interconnect level of the integrated circuit 600 defined by the first interconnect pattern 610 and the second interconnect pattern 618. A first lead 628 and a second lead 630 are formed by the metal etch process in an area defined by the first lead pattern 616 and an area defined by the second lead pattern 624, respectively, so as to make electrical connections with the stretch crossconnect 606. The stretch crossconnect 606 is not electrically connected to other interconnect elements in the interconnect level other than the first lead 628 and the second lead 630.

Figure 7A:
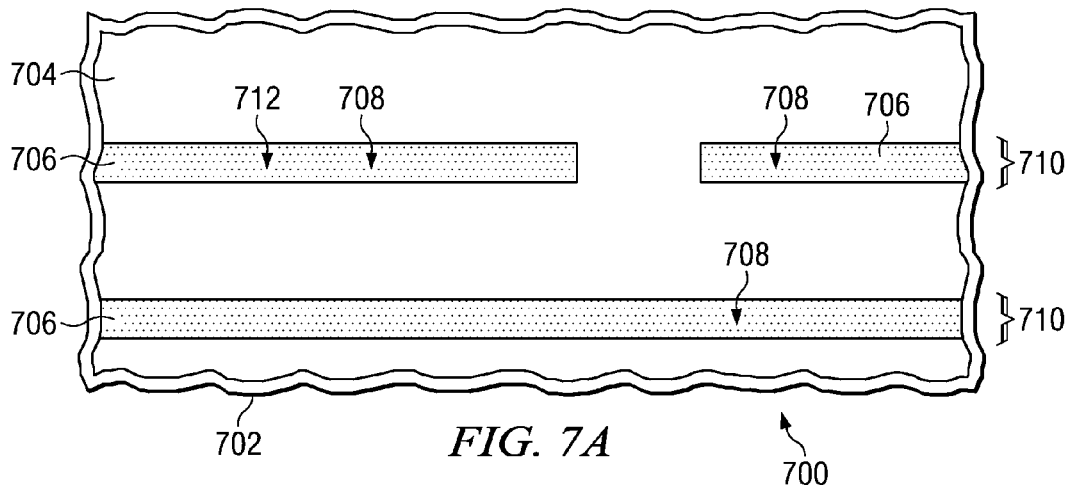
FIG. 7A through FIG. 7E are top views of an integrated circuit formed according the second embodiment using an etch-defined metal process, depicted in successive stages of fabrication.

FIG. 7A through FIG. 7E are top views of an integrated circuit formed according the second embodiment using an etch-defined metal process, depicted in successive stages of fabrication. Referring to FIG. 7A, the integrated circuit 700 is formed on a semiconductor substrate 702, and a dielectric layer stack is formed over the substrate 702, for example as described in reference to FIG. 5A. An interconnect metal layer 704 is formed over the dielectric layer stack, for example as described in reference to FIG. 6B.

A first interconnect pattern 706, depicted in FIG. 7A with a stipple pattern, is formed of photoresist over the interconnect metal layer 704 which includes a first plurality of masked areas 708 in a first plurality 710 of parallel route tracks. The first plurality of masked areas 708 includes a first lead pattern 712. The first interconnect pattern 706 may be formed using a positive tone develop process or a negative tone develop process, as described in reference to FIG. 4B.

Figure 7B:
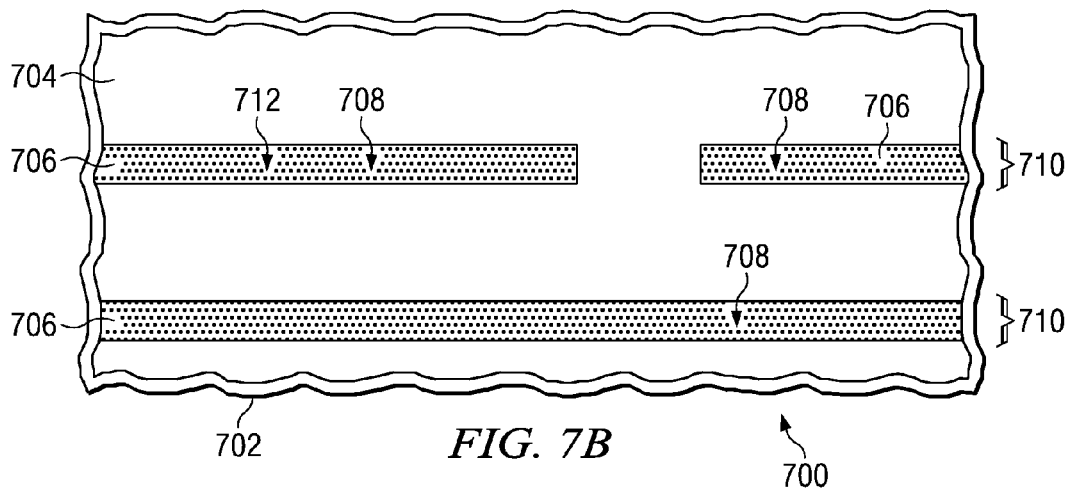

Referring to FIG. 7B, a resist freeze process, for example as described in reference to FIG. 6C, is performed which hardens the first interconnect pattern 706 so as to allow a second photoresist pattern to be formed on the integrated circuit 700. The first interconnect pattern 706 after completion of the resist freeze process is depicted in FIG. 7B with a coarse stipple pattern.

Figure 7C:
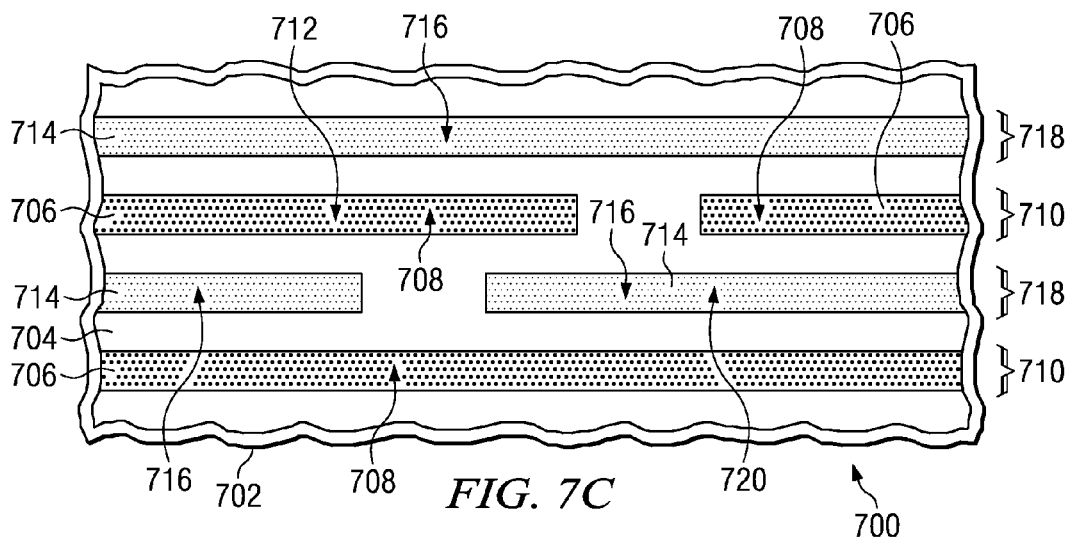

Referring to FIG. 7C, a separate second interconnect pattern 714, depicted in FIG. 7C with a stipple pattern, is formed of photoresist over the interconnect metal layer 704 which includes a second plurality of masked areas 716 in a second plurality 718 of parallel route tracks, in which the second plurality of route tracks 718 are alternated with the first plurality of route tracks 710. The second plurality of masked areas 716 includes a second lead pattern 720. An instance of the first plurality 710 of parallel route tracks containing the first lead pattern 712 is immediately adjacent to an instance of the second plurality 718 of parallel route tracks containing the second lead pattern 720.

Figure 7D:
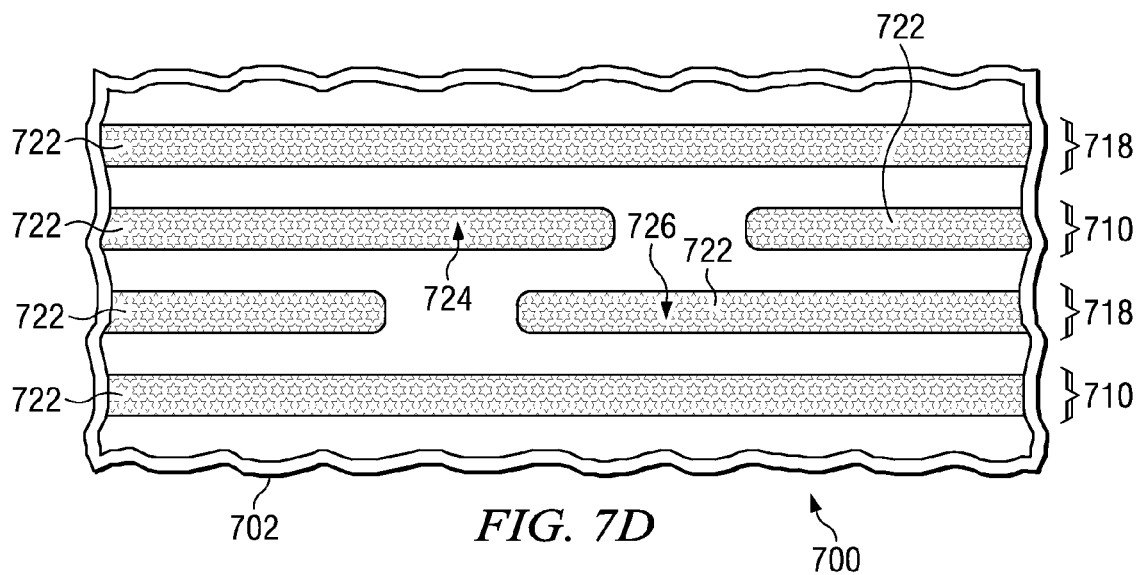

Referring to FIG. 7D, a metal etch process as described in reference to FIG. 6E is performed which removes metal from the interconnect metal layer 704 outside of the first interconnect pattern 706 and the second interconnect pattern 714 so as to form metal interconnect lines 722. The metal interconnect lines 722 are depicted in FIG. 7D with a star hatch pattern. The metal interconnect lines 722 are disposed in an interconnect level of the integrated circuit 700 defined by the first interconnect pattern 706 and the second interconnect pattern 714. A first lead 724 and a second lead 726 are formed by the metal etch process in an area defined by the first lead pattern 712 and an area defined by the second lead pattern 720, respectively.

Figure 7E:
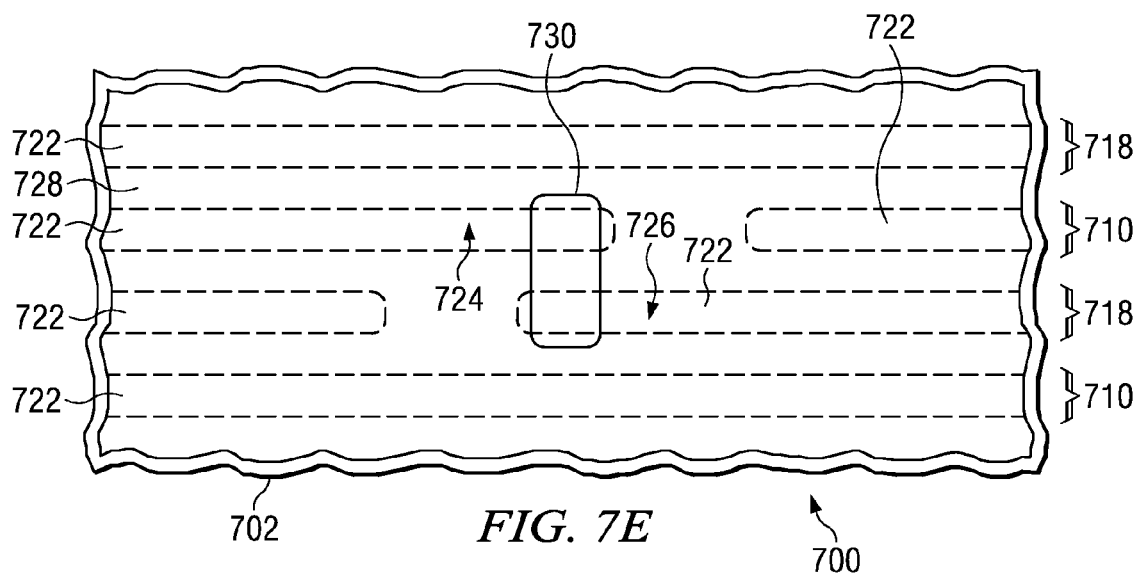

Referring to FIG. 7E, an ILD layer 728, for example as described in reference to FIG. 5F, is formed over the dielectric stack and the metal interconnect lines 722. A stretch crossconnect 730 is formed in the ILD layer 728, for example as described in reference to FIG. 5F, so as to make electrical contact to the first lead 724 and the second lead 726. The stretch crossconnect 730 is formed concurrently with inter-level interconnect elements in the integrated circuit 700. The stretch crossconnect 730 is free of electrical connections to elements above the stretch crossconnect 730.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a semiconductor substrate;
   a plurality of metal interconnects disposed over said substrate in a first plurality of parallel route tracks and a second plurality of route tracks, in which said second plurality of route tracks are alternated with said first plurality of route tracks;
   a first lead in an instance of said first plurality of parallel route tracks;
   a second lead in an instance of said second plurality of parallel route tracks, such that said instance of said first plurality of parallel route tracks containing said first lead pattern is immediately adjacent to said instance of said second plurality of parallel route tracks containing said second lead pattern;
   a stretch crossconnect disposed in exactly one of a dielectric layer disposed above said plurality of metal interconnects and a dielectric layer disposed below said plurality of metal interconnects, said stretch crossconnect being electrically connected said first lead and said second lead, such that said stretch crossconnect is free of electrically connection to other interconnect elements other than said first lead and said second lead, and said stretch crossconnect is formed concurrently with other vertical interconnect elements in said integrated circuit, in which said stretch crossconnect is a contact disposed in a pre-metal dielectric (PMD) layer under said plurality of metal interconnects.

* * * * *